US008762805B2

(12) United States Patent
Cideciyan et al.

(10) Patent No.: US 8,762,805 B2
(45) Date of Patent: Jun. 24, 2014

(54) DECODING ENCODED DATA CONTAINING INTEGRATED DATA AND HEADER PROTECTION

(75) Inventors: Roy Daron Cideciyan, Rueschlikon (CH); Hisato Matsuo, Yokohama (JP); Thomas Mittelholzer, Zurich (CH); Kenji Ohtani, Fujisawa (JP); Paul J Seger, Tucson, AZ (US); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 501 days.

(21) Appl. No.: 12/957,651

(22) Filed: Dec. 1, 2010

(65) Prior Publication Data

US 2012/0144271 A1    Jun. 7, 2012

(51) Int. Cl.
*G06F 11/00* (2006.01)

(52) U.S. Cl.
USPC .......................................... 714/746; 714/784

(58) Field of Classification Search
CPC . G06F 12/0246; G06F 11/1008; G06F 11/00; G06F 2212/2022; G06F 3/064; G06F 11/1044; G06F 11/108
See application file for complete search history.

(56) References Cited

U.S. PATENT DOCUMENTS

| 5,369,532 | A | 11/1994 | Dodt et al. |
| 5,369,641 | A | 11/1994 | Dodt et al. |
| 5,375,127 | A | 12/1994 | Leak et al. |
| 5,438,573 | A | 8/1995 | Mangan et al. |
| 5,576,903 | A | 11/1996 | Brown et al. |
| 5,946,328 | A | 8/1999 | Cox et al. |
| 6,397,366 | B1 * | 5/2002 | Tanaka et al. ................ 714/769 |
| 6,490,243 | B1 * | 12/2002 | Tanaka et al. ................ 370/216 |

(Continued)

FOREIGN PATENT DOCUMENTS

| EP | 0297809 B1 | 11/1992 |
| EP | 2234305 A1 | 9/2010 |

(Continued)

OTHER PUBLICATIONS

Standard ECMA-319, Standardizing Information and Communication Systems, Data Interchange on 12,7 mm 384-Track Magnetic Tape Cartridges—Ultrium-1 Format, Jun. 2001, http://www.ecma.ch.

(Continued)

*Primary Examiner* — Scott Baderman
*Assistant Examiner* — Jason Bryan
(74) *Attorney, Agent, or Firm* — Nelson and Nelson; Daniel P. Nelson; Alexis V. Nelson (57) ABSTRACT

A method for decoding encoded data comprising integrated data and header protection is disclosed herein. In one embodiment, such a method includes receiving an extended data array. The extended data array includes a data array organized into rows and columns, headers appended to the rows of the data array, column ECC parity protecting the columns of the data array, and row ECC parity protecting the rows and headers combined. The method then decodes the extended data array. Among other operations, this decoding step includes checking the header associated with each row to determine whether the header is legal. If the header is legal, the method determines the contribution of the header to the corresponding row ECC parity. The method then reverses the contribution of the header to the corresponding row ECC parity. A corresponding apparatus (i.e., a tape drive configured to implement the above-described method) is also disclosed herein.

20 Claims, 7 Drawing Sheets

(56) References Cited

U.S. PATENT DOCUMENTS

| | | |
|---|---|---|
| 6,718,510 B2 | 4/2004 | Kojima |
| 6,978,414 B2 | 12/2005 | Maple et al. |
| 7,046,610 B2 | 5/2006 | Sakagami et al. |
| 7,076,660 B2 | 7/2006 | Newman |
| 7,376,888 B2 | 5/2008 | Jaquette et al. |
| 7,475,324 B2 | 1/2009 | Nagai |
| 2003/0147167 A1 | 8/2003 | Asano et al. |
| 2004/0261001 A1 | 12/2004 | Chang et al. |
| 2005/0229085 A1 | 10/2005 | Van Dijk et al. |
| 2007/0150790 A1 | 6/2007 | Gross et al. |
| 2008/0184089 A1* | 7/2008 | Cideciyan et al. ............ 714/756 |
| 2008/0201625 A1 | 8/2008 | Mulligan |
| 2009/0037793 A1 | 2/2009 | Chuang et al. |
| 2009/0177943 A1 | 7/2009 | Silvus et al. |
| 2010/0180180 A1 | 7/2010 | Cideciyan et al. |

FOREIGN PATENT DOCUMENTS

| | | |
|---|---|---|
| JP | 55122213 A | 9/1980 |
| JP | 63046660 A | 2/1988 |
| JP | 10501948 A | 2/1998 |
| JP | 2000353361 A | 12/2000 |
| JP | 2005276362 A | 10/2005 |
| JP | 2008186572 A | 8/2008 |
| WO | WO2009074978 A | 6/2009 |
| WO | WO2009074978 A2 | 6/2009 |

OTHER PUBLICATIONS

El-Soudani, Magdi, "Multistage Coding for Data Storage System," Proceedings of IEEE Singapore International Conference on Networks/International Conference on Information Engineering, 1995.

Schroeder, Bianca, et al. "DRAM Errors in the Wild: A Large-Scale Field Study," SIGMETRICS/Performance'09, Jun. 15-19, 2009, Seattle, WA, USA.

International Search Authority, International Search Report and Written Opinion, PCT Application EP2011/068006, Mar. 5, 2012.

PCT International Search Report and Written Opinion, International Application No. PCT/EP2011/055392, Oct. 19, 2011.

Jaquette, G.A., "LTG; A Better Format for Mid-Range Tape," IBM Journal of Research and Development, pp. 429-444, Jul. 2003.

* cited by examiner

Data in SDS 102 | Row ECC Parity 104a
Column ECC Parity 106

Fig. 5

Data in SDS 102 | Updated Row ECC Parity 104b
Column ECC Parity 106
Headers 108

DECODING ENCODED DATA CONTAINING INTEGRATED DATA AND HEADER PROTECTION

BACKGROUND

1. Field of the Invention

This invention relates to tape drives, and more particularly to apparatus and methods for decoding encoded data containing integrated data and header protection.

2. Background of the Invention

In some tape drives, such as current linear tape open (LTO) and enterprise-level tape drives, variable-length blocks of data are received from a host interface and converted into fixed units known as data sets. These data sets are typically broken down into smaller fixed units known as sub data sets (SDSs). Error correction coding is then performed on these sub data sets as a unit to protect the data contained therein.

To protect data in an SDS, conventional tape drives may organize a sub data set into a two-dimensional array made up of rows and columns. Each row in the two-dimensional array may be made up of multiple (e.g., 2 or 4) interleaved data words. Error correction parity bits or symbols, where symbols consist of multiple bits, may then be generated for each row in the array and each column in the array to protect the data contained therein. This in essence provides two dimensions of protection for data in the array since protection is provided for both the rows and columns. Once generated, the error correction parity bits or symbols may be appended to the array for eventual storage on the magnetic tape medium.

Once error correction parity bits or symbols are appended to the array, one or more headers may be generated and appended to each row in the array. These headers generally store addressing information and other meta data associated with the data words in the array. These headers are typically not protected by error correction codes although they may contain error detection codes such as cyclic redundancy checks (CRCs). Generating and storing error correction parity bits or symbols in the headers may increase the size of the headers and undesirably reduce the efficiency of the storage format.

As the linear recording density for tape storage media continues to increase, error rates for the data and headers stored on the tape are also expected to increase. Errors in the data may be corrected using the error correction parity bits or symbols appended to the array. However, errors in the headers may be more problematic since they may not be protected by error correction codes. If a header is corrupt and cannot be recovered, all or part of the data that is referenced by the header may be lost. Conventional techniques for determining and correcting header errors using along-track and across-track interpolation are not sufficient to protect tape headers at high linear densities and track densities. Furthermore, formats that permit along-track and across-track interpolation are limited in flexibility to rewrite data that is detected in error during the read-while-write operation.

In view of the foregoing, what is needed is an encoding scheme to more effectively protect headers in current or future tape storage formats. More specifically, an encoding scheme is needed to generate error correction parity bits or symbols for data and headers that will provide sufficient protection for both while not incurring restrictions on rewrite flexibility. Such an encoding scheme will also ideally preserve storage format efficiency. Further needed is a decoding scheme for reliably decoding data encoded using the above-mentioned encoding scheme. Ideally, such a decoding scheme will reliably decode encoded data even in the presence of errors, such as dynamic random access memory (DRAM) errors.

SUMMARY

The invention has been developed in response to the present state of the art and, in particular, in response to the problems and needs in the art that have not yet been fully solved by currently available apparatus and methods. Accordingly, the invention has been developed to provide apparatus and methods to decode encoded data containing integrated data and header protection. The features and advantages of the invention will become more fully apparent from the following description and appended claims, or may be learned by practice of the invention as set forth hereinafter.

Consistent with the foregoing, a method for decoding encoded data comprising integrated data and header protection is disclosed herein. In one embodiment, such a method includes receiving an extended data array. The extended data array includes a data array organized into rows and columns, headers appended to the rows of the data array, column error correction code (ECC) parity protecting the columns of the data array, and row ECC parity protecting the rows and headers combined. The method then decodes the extended data array. Among other operations, this decoding step includes checking the header associated with each row to determine whether the header is legal. If the header is legal, the method determines the contribution of the header to the corresponding row ECC parity. The method then reverses the contribution of the header to the corresponding row ECC parity.

A corresponding apparatus (i.e., a tape drive configured to implement the above-described method) is also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

As will be appreciated by one skilled in the art, the present invention may be embodied as an apparatus, system, method, or computer program product. Furthermore, the present invention may take the form of a hardware embodiment, a software embodiment (including firmware, resident software, microcode, etc.) configured to operate hardware, or an embodiment combining both software and hardware elements. Each of these embodiments may be represented by one or more modules or blocks. Furthermore, the present invention may take the form of a computer-usable storage medium embodied in any tangible medium of expression having computer-usable program code stored therein.

Any combination of one or more computer-usable or computer-readable storage medium(s) may be utilized to store the computer program product. The computer-usable or computer-readable storage medium may be, for example but not limited to, an electronic, magnetic, optical, electromagnetic, infrared, or semiconductor system, apparatus, or device. More specific examples (a non-exhaustive list) of the computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, or a magnetic storage device. In the context of this document, a computer-usable or computer-readable storage medium may be any medium that can contain, store, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like, and conventional procedural programming languages, such as the "C" programming language or similar programming languages. Computer program code for implementing the invention may also be written in a low-level programming language such as assembly language.

The present invention may be described below with reference to flowchart illustrations and/or block diagrams of methods, apparatus, systems, and computer program products according to various embodiments of the invention. It will be understood that each block of the flowchart illustrations and/or block diagrams, and combinations of blocks in the flowchart illustrations and/or block diagrams, may be implemented by computer program instructions or code. The computer program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
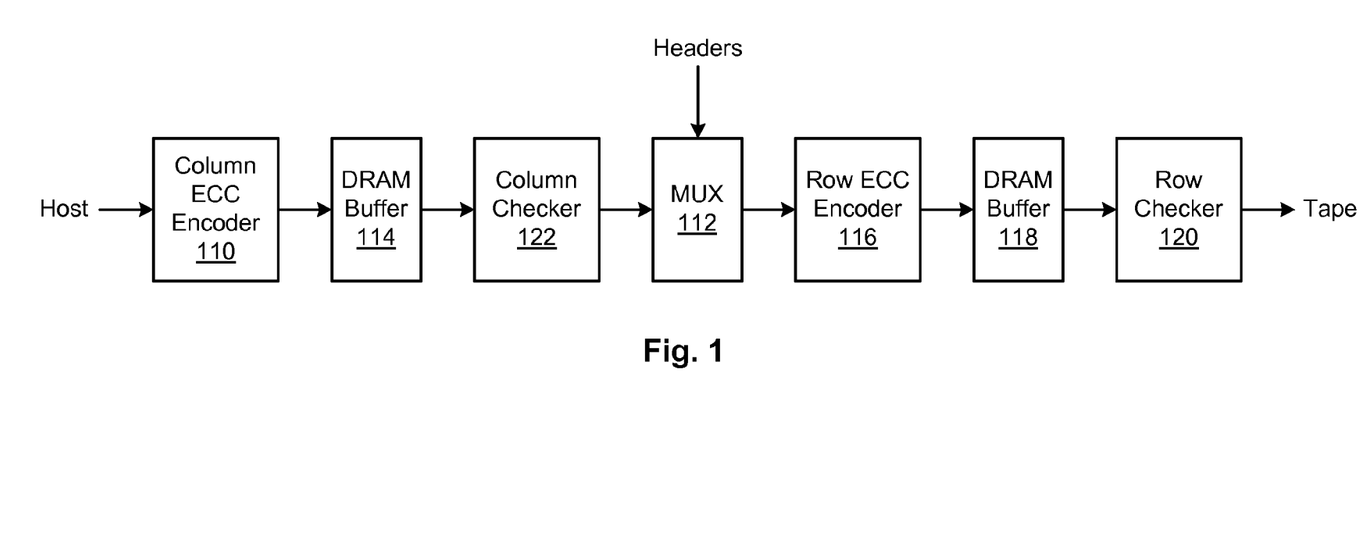
FIG. 1 is a high-level flow diagram showing one embodiment of an encoding scheme for integrating data and header protection.
Figure 2:
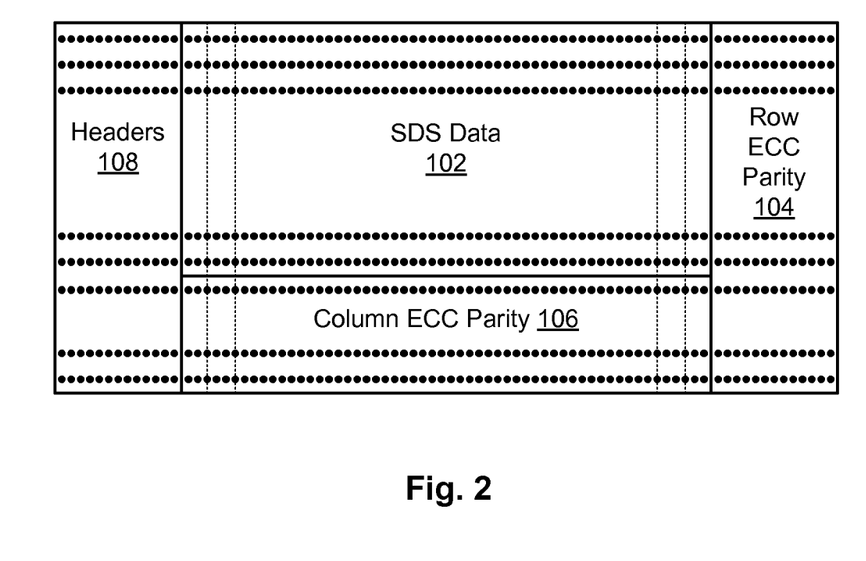
FIG. 2 shows how ECC parity and headers are generated and appended to a data array using the encoding scheme of FIG. 1.

Referring to FIG. 1, while also referring generally to FIG. 2, a flow diagram showing one example of an encoding scheme for integrating data and header protection in tape drives is illustrated. As shown, processed (e.g., encrypted and/or compressed) host data is received by a column ECC encoder 110 in fixed units known as sub data sets (SDSs) 102 (see FIG. 2). Each SDS 102 is organized into a data array 102 made up of rows and columns. Upon receiving the data array 102, the column ECC encoder 110 generates ECC parity 106 for each column in the array 102 and appends the column ECC parity 106 to the array 102. The extended array (i.e., the SDS data 102, and column ECC parity 106) is written to a DRAM buffer 114.

A column checker 122 then checks each column of the extended array for errors, which may include DRAM errors. This may be accomplished, for example, by recalculating the column ECC parity for each column and comparing this column ECC parity with the stored column ECC parity 106 in the DRAM buffer 114. If the newly computed column ECC parity matches the stored column ECC parity 106, then the column can be assumed to be error-free. If the newly computed column ECC parity does not match the stored column ECC parity 106, then it can be assumed that the column contains errors. If errors are detected in a column, the stored column ECC parity 106 may be used to correct a number of errors in the column up to the corrective capability of the column ECC parity 106.

A multiplexer 112 then appends headers 108 to the rows of the array 102. The position of the headers 108 is arbitrary, meaning that the headers 108 may be placed at the beginning of each row, at the end of each row, be interleaved with each row, or the like. The extended array (i.e., the SDS data 102, headers 108, and column ECC parity 106) is then passed to a row ECC encoder 116 which generates ECC parity 104 for each row (which includes the SDS data 102, the column ECC parity 106, and headers 108) and appends the ECC parity 104 to the extended array. Thus, the row ECC encoder 116 generates row ECC parity 104 for the SDS data 102, the column ECC parity 106, and headers 108 combined. This in essence provides two dimensions of protection for the SDS data 102 (i.e., by providing both row and column ECC parity 104, 106) while providing a single dimension of protection for the headers 108 (by providing row ECC parity 104 only). This technique preserves format efficiency while providing sufficient ECC protection for the headers 108. The extended array is written to a DRAM buffer 118, which may be the same or different from the DRAM buffer 114.

Once the extended array is written to the DRAM buffer 118, a row checker 120 checks each row of the extended array for errors, which may include DRAM errors. This may be accomplished, for example, by recalculating the row ECC parity for each row and comparing this row ECC parity with the stored row ECC parity 104 in the DRAM buffer 118. If the newly computed row ECC parity matches the stored row ECC parity 104, then the row can be assumed to be error-free. If the newly computed row ECC parity does not match the stored row ECC parity 104, then it can be assumed that the row contains errors. If errors are detected in the row, the stored row ECC parity 104 may be used to correct a number of errors in the row up to the corrective capability of the row ECC parity 104.

To illustrate the effectiveness of integrating data and header protection, assume that the SDS data 102 and headers 108 are protected in the manner described above. If the SDS data 102, row ECC parity 104, column ECC parity 106, and headers 108 are written to tape and an error is detected in a header 108 during the read-while-write process, the data 102, column ECC parity 106, row ECC parity 104 and headers 108 may be rewritten to the magnetic medium. However, the headers 108 and row ECC parity 104 may need to be modified prior to performing the rewrite to update the addressing and metadata contained therein. The data 102 and column ECC parity 106, on the other hand, may remain unchanged. Because the headers 108 are protected by a single dimension of ECC parity (i.e., are protected by row ECC parity 104 only), only the row ECC parity 104 needs to be recomputed for the updated headers 108, as opposed to needing to recompute both row and column ECC parity 104, 106. Furthermore, only the row ECC parity 104 for those rows whose headers 108 have changed needs to be recomputed. Thus, protecting the headers 108 with a single dimension of ECC protection provides adequate protection for the headers 108 while still preserving format efficiency.

It should be recognized that, in some embodiments, each row of the SDS array 102 may be made up of multiple interleaved data words. As an example, each row in the SDS array 102 may include four interleaved data words of 234 bytes each, making each row 936 bytes long. The data words may be interleaved on a byte-by-byte or other suitable basis. Similarly, the row ECC parity 104 and headers 108 associated with the rows may also be interleaved. For example, four interleaved headers 108 (one for each data word in the row) of three bytes each may be associated with each row in the array 102, making each row of headers 108 twelve bytes long. The headers 108 may be interleaved on a byte-by-byte or other suitable basis. Similarly, four interleaved row ECC parity bits or symbols 104 (one for each data word in the row) of twelve bytes each may be associated with each row in the array 102, making each row of ECC parity codes 104 forty-eight bytes long. The row ECC parity codes 104 may be interleaved on a byte-by-byte or other suitable basis. Using the numbers provided above, each row (including the headers 108, the SDS data 102, and the row ECC parity 104) would be 996 bytes long. These numbers are provided only by way of example and are not intended to be limiting. Also, interleaving is not necessarily used in all embodiments.

The instant inventors have found that using the numbers provided above (i.e., 234 bytes for each data word 102, three bytes for each header 108, and twelve bytes for row ECC parity 104), up to five bytes of the combined header 108 and data word 102 may be corrected using the twelve byte row ECC parity 104. Furthermore, all three bytes in the header 108 may be corrected using the twelve byte row ECC parity 104. If the data is interleaved, up to twenty consecutive interleaved bytes may be corrected assuming a margin of one byte of error correction capability is used to reduce the miscorrection probability. In short, integrating the header and data protection is significantly more efficient than independently protecting the header 108 and data 102 with ECC parity.

Figure 3:
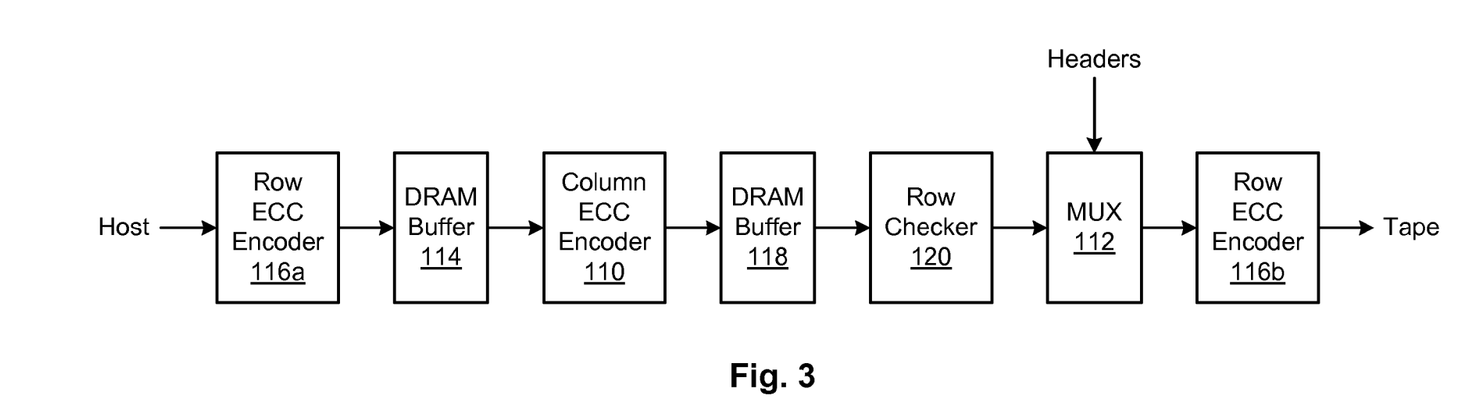
FIG. 3 is a high-level flow diagram showing an alternative embodiment of an encoding scheme for integrating data and header protection.
Figure 4:
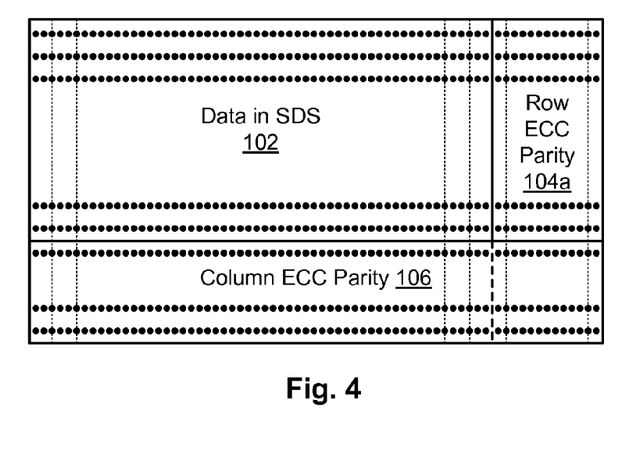
FIGS. 4 and 5 show how ECC parity and headers are generated and appended to a data array using the encoding scheme of FIG. 3.
Figure 5:
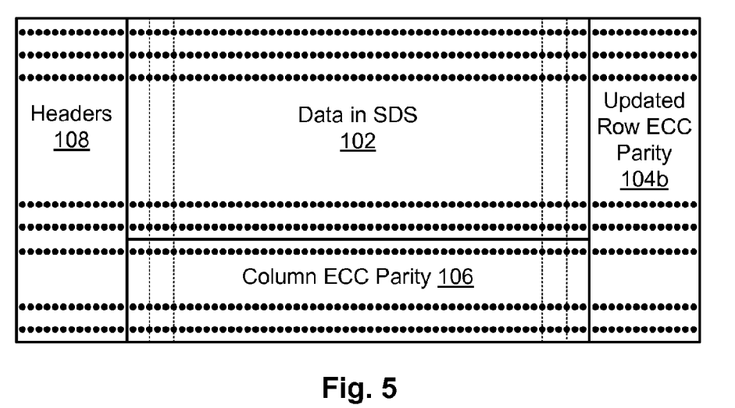

Referring to FIG. 3, while also referring generally to FIGS. 4 and 5, an alternative embodiment of an encoding scheme for integrating data and header protection is illustrated. In this embodiment, upon receiving an SDS array 102, a row ECC encoder 116a generates row ECC parity 104a for the SDS data 102 and appends it to the array 102, as shown in FIG. 4. The extended array is written to a DRAM buffer 114. A column ECC encoder 110 then generates ECC parity 106 for each column in the SDS array 102 (including the row ECC parity 104) and appends the column ECC parity 106 to the array 102, as further shown in FIG. 4. This extended array is written to a DRAM buffer 118, which may be the same or different from the DRAM buffer 114. Once the extended array is written to the DRAM buffer 118, a row checker 120 checks each row of the extended data array for errors. If errors are found, the row checker 120 corrects the errors up to the corrective capability of the row ECC parity 104a.

A multiplexer 112 then appends headers 108 to the rows, as shown in FIG. 5. The extended array 102 (i.e., the SDS data 102, headers 108, column ECC parity 106, and row ECC parity 104) may then be passed to the same or a different row ECC encoder 116b to update the row ECC parity 104a for each row, which now includes a header 108. This produces the updated row ECC parity 104b illustrated in FIG. 5. In this way, two dimensions of ECC protection are provided for the SDS data 102 and a single dimension of ECC protection is provided for the headers 108. One potential advantage of using the encoding scheme illustrated in FIG. 3, as opposed to that illustrated in FIG. 1, is that it may be easier to implement the encoding scheme using conventional ECC encoding hardware. In addition, it is sufficient to have only one row checker in FIG. 3 to detect and correct DRAM errors whereas a column checker and a row checker are required in FIG. 1 to detect and correct DRAM errors. Nevertheless, other encoding schemes and accompanying hardware may also be capable of integrating data and header protection in the manner described above. Such encoding schemes and accompanying hardware are intended to be included within the scope of the invention.

Figure 6:
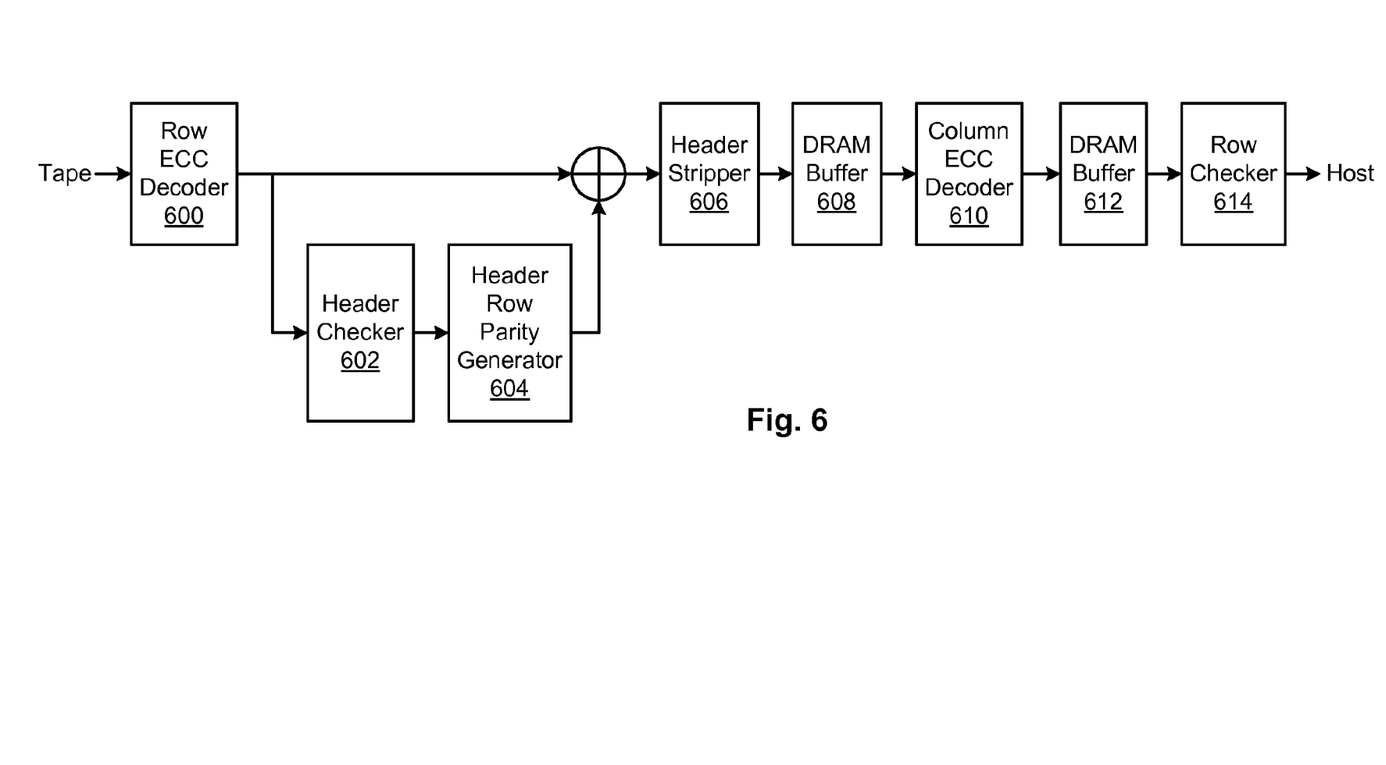
FIG. 6 is a high-level flow diagram showing one embodiment of a decoding scheme for decoding encoded data having integrated data and header protection.

Referring to FIG. 6, one embodiment of a decoding scheme for decoding encoded data having integrated data and header protection is illustrated. As shown, encoded data (e.g., the extended data array illustrated in FIG. 5) stored on tape is received by a row ECC decoder 600. Using the row ECC parity 104b in the extended data array, the row ECC decoder 600 corrects errors in the rows (which include both the SDS data 102, column ECC parity 106, and headers 108) up to the corrective capability of the row ECC parity 104b.

When the row ECC decoder 600 decodes a row of the extended data array, a header checker 602 checks the header 108 associated with the row to determine if the header 108 is legal. For example, the header checker 602 may check a CRC or other error detection code associated with the header 108 to determine if the header 108 contains errors, and is thus illegal. Alternatively, or additionally, the header checker 602 may check the content of the header 108 to determine whether the content is legal. For example, rules may be established that define what values or ranges of values certain bits or groups of bits in the header 108 may have. A header 108 may be deemed legal if the bits or groups of bits (i.e., the content of the header 108) comply with these rules. It follows that the header 108 may be deemed illegal if the bits or groups of bits do not comply with these rules.

If a header 108 is legal, a header row parity generator 604 calculates row parity associated with the header 108. One method for calculating this header row ECC parity is discussed in association with FIG. 8. This calculation determines the effect of the header 108 on the row ECC parity 104b. Stated otherwise, the header row parity generator 604 determines the contribution of the header 108 to the row ECC parity 104b. Once the header row ECC parity is calculated, the header row ECC parity is added (using bit-by-bit XOR) to the row ECC parity 104b at the output of the row ECC decoder 600 to reverse the contribution of the header 108 to the row ECC parity 104b. In other words, using FIGS. 4 and 5 as an example, the updated row ECC parity 104b, as illustrated in FIG. 5, will be reverted to the original row ECC parity 104a illustrated in FIG. 4.

Once the contribution of the headers 108 is reversed from the row ECC parity 104b, a header stripper 606 strips the headers 108 from the extended data array. This will produce an extended data array like that illustrated in FIG. 4. This extended data array is written to a DRAM buffer 608. Rows that contain too many errors to be corrected by the row ECC parity 104b or rows that include headers 108 that are illegal are not transferred to the DRAM buffer 608. The extended data array is then passed to a column ECC decoder 610. Using the column ECC parity 106, the column ECC decoder 610 reconstructs any missing rows up to the corrective capability of the column ECC parity 106. The corrected extended data array is written to a DRAM buffer 612, which may be the same or different from the DRAM buffer 608. Using the row ECC parity 104a, a row checker 614 then checks the extended data array for errors, such as DRAM errors, and corrects any errors that are found therein. The corrected (i.e., decoded) SDS data 102 may then be passed to a host device.

It should be recognized that the decoding scheme illustrated in FIG. 6 is presented by way of example and is not intended to be limiting. In other embodiments, the functional blocks illustrated in FIG. 6 are organized or configured differently. For example, in some embodiments, the decoding scheme is reorganized such that column ECC decoding is performed prior to row ECC decoding. Other variations or modifications are also possible. Thus, the decoding scheme illustrated in FIG. 6 is presented only by way of example and not limitation.

Figure 7:
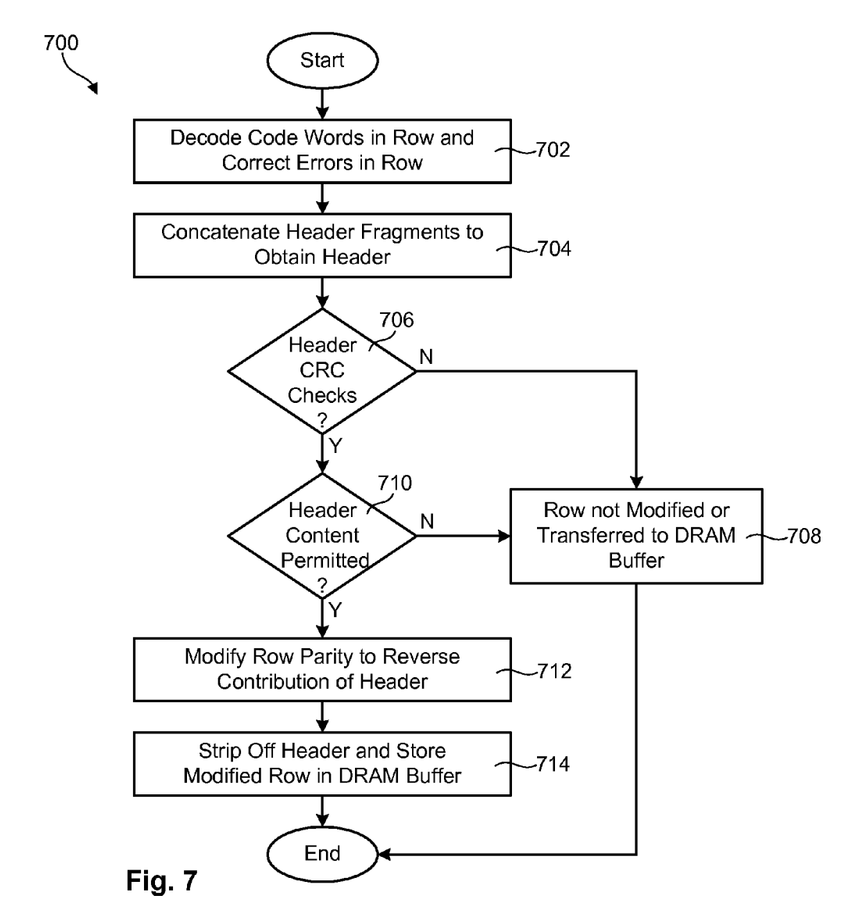
FIG. 7 is a flow diagram showing one embodiment of a method for incorporation into the decoding scheme of FIG. 6.

Referring to FIG. 7, a flow diagram showing one embodiment of a method 700 for incorporation into the decoding scheme of FIG. 6 is illustrated. Such a method 700 may be performed for each row in the extended data array. As shown, the method 700 initially decodes 702 the code words in a row and corrects 702 errors in the row using the associated row ECC parity 104b. If needed, the method 700 concatenates 704 header fragments (e.g., the three-byte headers 108 associated with the data words in a row) to obtain a complete header 108 (e.g., a twelve-byte header 108). The method 700 then determines whether the header 108 is legal. This may include checking 706 a CRC or other error detection code associated with the header 108 to determine if the header contains errors. If the header contains errors, the row is not modified or transferred to the DRAM buffer 608, as reflected at step 708. Determining whether the header 108 is legal may also include determining 710 whether the content of the header 108 is legal. This may include determining whether various fields (i.e., bits or groups of bits) in the header 108 contain allowed values or are within a range of allowed values. If all or part of the header content is illegal, the row associated with the header 108 is not modified or transferred to the DRAM buffer 608, as reflected at step 708.

In the event the header 108 is legal, the method 700 modifies 712 the row ECC parity 104b to reverse the contribution of the header 108 to the row ECC parity 104b. As previously mentioned, this may be accomplished by calculating the row ECC parity for the header only, and then adding the header row ECC parity (using bit-by-bit XOR) to the row ECC parity 104b to remove the contribution of the header 108. This will modify the row ECC parity 104b such that it only protects the data 102, as opposed to protecting both the data 102 and header 108. The method 700 then strips off 714 the header 108 and stores 714 the modified row with the modified row ECC parity 104a in the DRAM buffer 608. As previously mentioned, the column ECC parity 106 may be used to reconstruct rows that are not transferred to the DRAM buffer 608 because they had illegal headers 108 or had too many errors to be corrected by the row ECC parity 104b.

Figure 8:
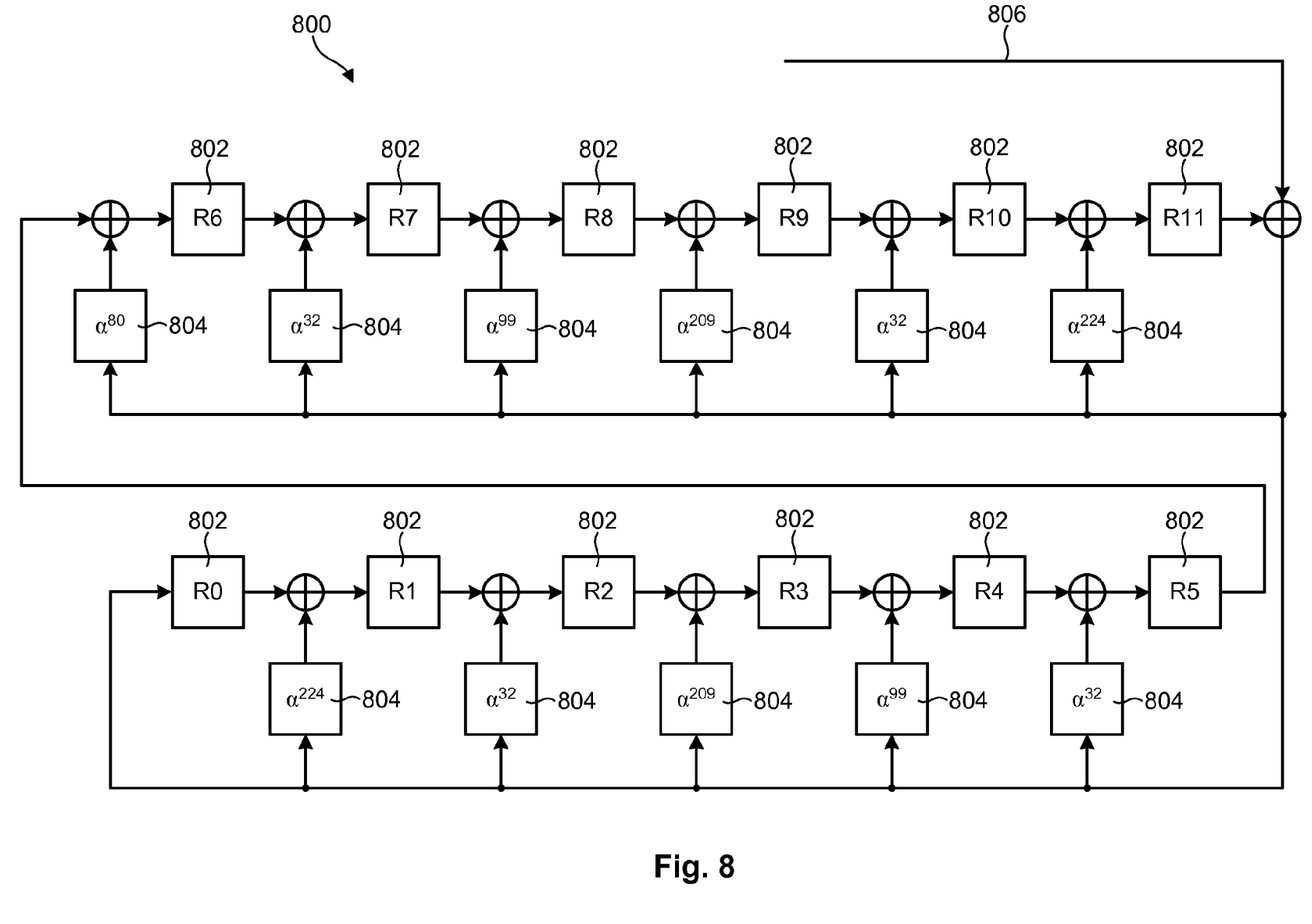
FIG. 8 is a high-level block diagram showing one embodiment of a Reed-Solomon circuit used during both the encoding and decoding processes.

Referring to FIG. 8, one embodiment of a Reed-Solomon circuit 800 is illustrated. Such a circuit 800 may be used during both the encoding and decoding processes. For example, the circuit 800 may be used to calculate the row ECC parity 104b for the data 102 and headers 108 during the encoding process. The circuit 800 may also be used to calculate the contribution of headers 108 to the row ECC parity 104b during the decoding process. As shown, the encoder circuit 800 includes a number of registers 802, in this example twelve registers 802 (labeled R0, R1, . . . , R11), each of which stores a symbol, such as a byte of data. The registers 802 are connected sequentially with feedback. The encoder circuit 800 further includes eleven multipliers 804 (each expressed as a raised to some power n) interacting with the registers 802 in the illustrated manner. Each of the multipliers 804 multiplies an input value by some fixed value $\alpha^n$. The product is added to a register's value and stored in the next register.

To determine the contribution of a header 108 to the row ECC parity 104b during the decoding process in the case where integrated header encoding is based on data bytes being first fed into the encoding circuit, the values in the registers 802 may be initialized to zero. The three-byte header 108 associated with the 234-byte data word is then fed sequentially, byte-by-byte, into the circuit 800. Once these bytes have been fed into the circuit 800 (which should take 3 clock cycles), the twelve registers 802 will contain the twelve ECC parity bytes that represent the contribution of the three-byte header 108 to the row ECC parity 104b. The header contribution may then be added (using bit-by-bit XOR) to the row ECC parity 104b. This will modify the row ECC parity 104b so that it only protects the data 102 (or the column ECC parity 106) as opposed to the combined data 102 (or the column ECC parity 106) and header 108.

To determine the contribution of a header 108 to the row ECC parity 104b during the decoding process in the case where integrated header encoding is based on header bytes being first fed into the encoding circuit, the values in the registers 802 may be initialized to zero. The three-byte header 108 associated with a 234-byte data word is then fed sequentially, byte-by-byte, into the circuit 800, followed by 234 zero bytes. Once these bytes have been fed into the circuit 800 (which should take 237 clock cycles), the twelve registers 802 will contain the twelve ECC parity bytes that represent the contribution of the three-byte header 108 to the row ECC parity 104b. The header contribution may then be added (using bit-by-bit XOR) to the row ECC parity 104b. This will modify the row ECC parity 104b so that it only protects the data 102 (or the column ECC parity 106) as opposed to the combined data 102 (or the column ECC parity 106) and header 108.

The flowcharts and block diagrams in the Figures illustrate the architecture, functionality, and operation of possible implementations of systems, methods, and computer-usable media according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for decoding encoded data comprising integrated data and header protection, the method comprising:
  receiving, by at least one processor, an extended data array, the extended data array comprising a data array organized into rows and columns, headers appended to the rows of the data array, column ECC parity calculated for the columns of the data array, and row ECC parity calculated for the rows and headers combined;
  decoding, by the at least one processor, the extended data array, wherein decoding the extended data array comprises:
    checking the header associated with each row to determine whether the header is legal;
    if the header is legal, determining the contribution of the header to the corresponding row ECC parity for the combined row and header; and
    reversing the contribution of the header to the corresponding row ECC parity to generate a reverted row ECC parity for the row without the header.

2. The method of claim 1, wherein decoding the extended data array further comprises stripping the header from the row.

3. The method of claim 1, wherein checking the header comprises checking the content of the header.

4. The method of claim 1, wherein checking the header comprises performing a cyclic redundancy check on the header.

5. The method of claim 1, further comprising, if the header is legal, transferring the row to a DRAM buffer.

6. The method of claim 5, further comprising, if the header is not legal, not transferring the row to the DRAM buffer.

7. The method of claim 1, wherein reversing the contribution of the header to the corresponding row ECC parity comprises generating header row ECC parity associated with the header, and adding the header row ECC parity to the corresponding row ECC parity to generate the reverted row ECC parity.

8. The method of claim 1, wherein the data array is a sub data set (SDS) organized into an array format.

9. The method of claim 1, wherein the row ECC parity and column ECC parity comprise Reed-Solomon parity.

10. The method of claim 1, wherein each row comprises at least one data word.

11. A tape drive for decoding encoded data comprising integrated data and header protection, the tape drive comprising:
  a decoder, implemented in one of hardware and software operating on hardware, to receive an extended data array, the extended data array comprising a data array organized into rows and columns, headers appended to the rows of the data array, column ECC parity calculated for the columns of the data array, and row ECC parity calculated for the rows and headers combined;
  the decoder configured to decode the extended data array, wherein decoding the extended data array comprises:
    checking the header associated with each row to determine whether the header is legal;
    if the header is legal, determining the contribution of the header to the corresponding ECC row parity for the combined row and header; and
    reversing the contribution of the header to the corresponding row ECC parity to generate a reverted row ECC parity for the row without the header.

12. The tape drive of claim 11, wherein decoding the extended data array further comprises stripping the header from the row.

13. The tape drive of claim 11, wherein checking the header comprises checking the content of the header.

14. The tape drive of claim 11, wherein checking the header comprises performing a cyclic redundancy check on the header.

15. The tape drive of claim 11, wherein the decoder is further configured to transfer the row to a DRAM buffer if the header is legal.

16. The tape drive of claim 15, wherein the decoder is further configured to not transfer the row to a DRAM buffer if the header is not legal.

17. The tape drive of claim 11, wherein reversing the contribution of the header to the corresponding row ECC parity comprises generating header row ECC parity associated with the header, and adding the header row ECC parity to the corresponding row ECC parity to generate the reverted row ECC parity.

18. The tape drive of claim 11, wherein the data array is a sub data set (SDS) organized into an array format.

19. The tape drive of claim 11, wherein the row ECC parity and column ECC parity comprise Reed-Solomon parity.

20. The tape drive of claim 11, wherein each row comprises at least one data word.

* * * * *